United States Patent
Lee et al.

(10) Patent No.: US 11,894,674 B2
(45) Date of Patent: Feb. 6, 2024

(54) PROTECTION CIRCUIT

(71) Applicant: Vanguard International Semiconductor Corporation, Hsinchu (TW)

(72) Inventors: Jian-Hsing Lee, Hsinchu (TW); Yeh-Ning Jou, Hsinchu (TW); Chih-Hsuan Lin, Hsinchu (TW); Chang-Min Lin, Taichung (TW); Hwa-Chyi Chiou, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 36 days.

(21) Appl. No.: 17/741,574

(22) Filed: May 11, 2022

(65) Prior Publication Data
US 2023/0369848 A1 Nov. 16, 2023

(51) Int. Cl.
*H02H 9/04* (2006.01)
*H01L 27/02* (2006.01)

(52) U.S. Cl.
CPC ......... *H02H 9/046* (2013.01); *H01L 27/0266* (2013.01)

(58) Field of Classification Search
CPC .. H01L 27/0266; H01L 27/0285; H02H 9/046
USPC .......................................................... 361/56
See application file for complete search history.

(56) References Cited

U.S. PATENT DOCUMENTS

| 5,663,678 A * | 9/1997 | Chang ................. H01L 27/0266 327/566 |
| 6,317,306 B1 * | 11/2001 | Chen ................... H01L 27/0288 257/357 |
| 6,867,957 B1 * | 3/2005 | Tong ................... H01L 27/0266 361/111 |

(Continued)

FOREIGN PATENT DOCUMENTS

| CN | 1373513 A | * 10/2002 |
| CN | 112740498 A | 4/2021 |

(Continued)

OTHER PUBLICATIONS

Lin Gang-Li; Voltage control element is suitable for ESD protection and a protection circuit thereof; Publication date: Oct. 9, 2002; Entire specifiation and drawings (Year: 2002).*

(Continued)

*Primary Examiner* — Dharti H Patel
(74) *Attorney, Agent, or Firm* — Birch, Stewart, Kolasch & Birch, LLP

(57) ABSTRACT

A power detection circuit is provided. The protection circuit is coupled to a pad and includes a trigger circuit and a discharge circuit. The trigger circuit includes a first transistor of a first conductivity type and a second transistor, also of the first conductivity type, which are coupled in series between the pad and a ground terminal. The trigger circuit detects whether a transient even occurs on the pad. The discharge circuit is coupled between the bonding pad and the ground terminal and controlled by the trigger circuit. In response to the transient event occurring on the bonding pad, the trigger circuit generates a trigger voltage to trigger the discharge circuit to provide a discharge path between the pad and the ground terminal.

19 Claims, 7 Drawing Sheets

(56) References Cited

U.S. PATENT DOCUMENTS

| | | | |
|---|---|---|---|
| 6,868,957 B2* | 3/2005 | Cassoli | B65G 47/841 |
| | | | 198/468.11 |
| 6,912,109 B1* | 6/2005 | Ker | H01L 27/0266 |
| | | | 361/111 |
| 9,172,244 B1* | 10/2015 | Ma | H01L 21/8234 |
| 10,475,781 B2 | 11/2019 | Jang et al. | |
| 11,652,477 B2* | 5/2023 | Huang | H03K 19/00346 |
| | | | 327/540 |
| 2005/0180071 A1* | 8/2005 | Wu | H01L 27/0288 |
| | | | 361/56 |
| 2005/0264963 A1* | 12/2005 | Sato | H01L 27/0262 |
| | | | 361/56 |
| 2009/0040668 A1* | 2/2009 | Chen | H01L 27/0285 |
| | | | 361/56 |
| 2013/0200460 A1* | 8/2013 | Chuang | H01L 27/0266 |
| | | | 257/358 |
| 2017/0163031 A1* | 6/2017 | Jou | H02H 9/04 |
| 2021/0281067 A1* | 9/2021 | Chen | H02H 9/046 |
| 2022/0311242 A1* | 9/2022 | Taghizadeh Kaschani | |
| | | | H02H 9/005 |

FOREIGN PATENT DOCUMENTS

| | | | |
|---|---|---|---|
| TW | 201622285 A | * | 6/2016 |
| TW | I587593 B | | 6/2017 |
| TW | I732615 B | | 7/2021 |

OTHER PUBLICATIONS

Taiwanese Office Action and Search Report for Taiwanese Application No. 111109312, dated Nov. 2, 2022.

* cited by examiner

PROTECTION CIRCUIT

BACKGROUND OF THE INVENTION

Field of the Invention

The present invention relates to a protection circuit, and more particularly, to a protection circuit that has high voltage tolerance and can quickly provide a discharge path.

Description of the Related Art

As the process of manufacturing integrated circuits has developed, the size of semiconductor components has been reduced to the sub-micron level to improve the performance and operation speed of the integrated circuits. However, this reduction in size has made it easy for semiconductor components to become damaged by a high current caused by voltage spikes. Therefore, when there is a large current or a high voltage (or both) in a very short period of time on an input/output bonding pad coupled to an integrated circuit, the circuit needs a protection circuit that can quickly respond to the large current or the high voltage and can stably provide a discharge path. For example, electrostatic discharge (ESD) protection circuits, transient voltage suppressors (TVS) and other protection devices or circuits can provide such a discharge path to protect the semiconductor components from being damaged by large currents. Therefore, the discharge efficiency (i.e., the protection capability) of these protection devices or circuits is really important.

BRIEF SUMMARY OF THE INVENTION

Thus, an exemplary embodiment of the present invention provides a protection circuit. The protection circuit is coupled to a bonding pad and includes a trigger circuit and a discharge circuit. The trigger circuit includes a first transistor of a first conductivity type and a second transistor of the first conductivity type, which are coupled in series between the bonding pad and a ground terminal. The trigger circuit detects whether a transient event occurs on the bonding pad. The discharge circuit is coupled between the bonding pad and the ground terminal and controlled by the trigger circuit. When a transient event occurs on the bonding pad, the trigger circuit generates a trigger voltage to trigger the discharge circuit to provide a discharge path between the bonding pad and the ground.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated model of carrying out the invention. This description is made for the purpose of illustrating the general principles of the invention and should not be taken in a limiting sense. The scope of the invention is best determined by reference to the appended claims.

Figure 1:
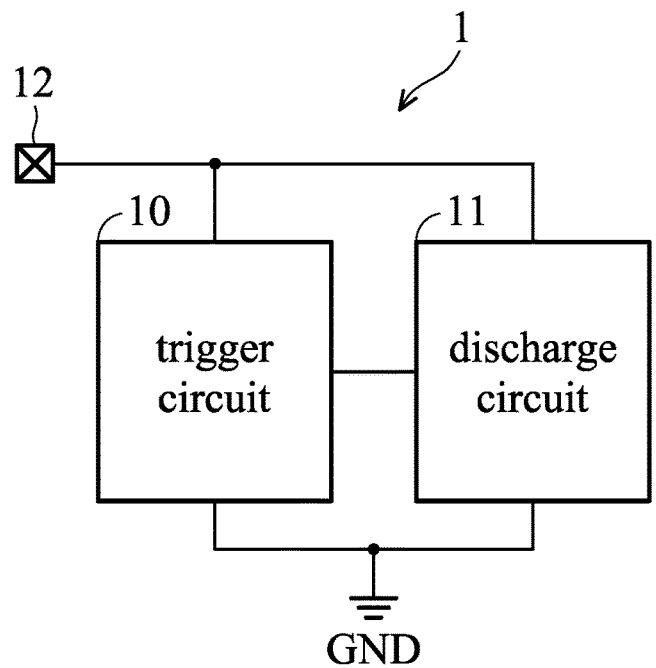
FIG. 1 shows a protection circuit according to an exemplary embodiment of the present invention.

FIG. 1 shows a protection circuit according to an exemplary embodiment of the present invention. Referring to FIG. 1, for the purpose of detailed explanation, in addition to a protection circuit 1, FIG. 1 also shows a bonding pad 12. As shown in FIG. 1, the protection circuit 1 is coupled to the bonding pad 12 and comprises a trigger circuit 10 and a discharge circuit 11. The trigger circuit 10 and the discharge circuit 11 are both coupled between the bonding pad 12 and a ground terminal GND.

When the protection circuit 1 operates in a normal operation mode, a supply voltage is provided to the bonding pad 12. In this case, the trigger circuit 10 controls the discharge circuit 11 not to provide any discharge path between the bonding pad 12 and the ground terminal GND. When the protection circuit 1 does not operate in the normal operation mode, the bonding pad 12 does not receive any supply voltage. In this case, the trigger circuit 10 detects whether a transient event occurs on the bonding pad 12. When detecting that a transient event occurs on the bonding pad 12, the trigger circuit 10 generates a signal or voltage to control or trigger the discharge circuit 11 to provide a discharge path between the bonding pad 12 and the ground terminal GND.

In the embodiment, the transient event may be an event involving a high voltage or a large current. For example, the transient event may be an electrostatic discharge (ESD) event or a surge event. In one embodiment, the protection circuit 1 may be an electrostatic discharge (ESD) protection circuit or a transient voltage suppressor (TVS).

Figure 2:
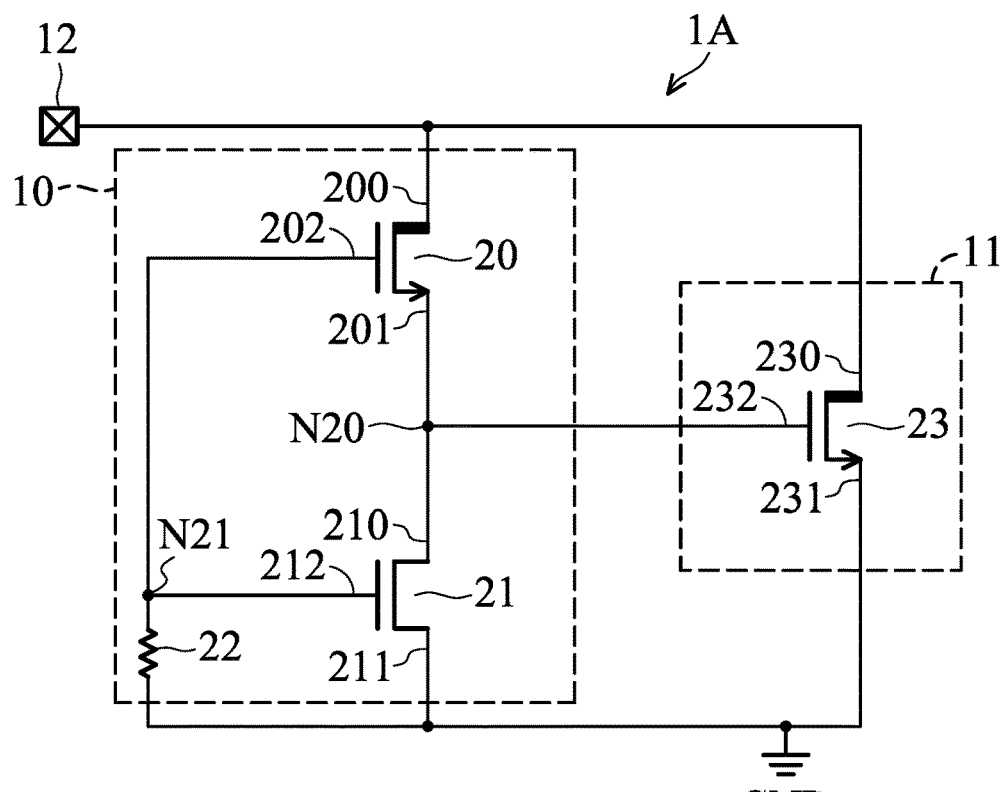
FIG. 2 shows a protection circuit according to another exemplary embodiment of the present invention.

FIG. 2 shows a protection circuit according to another exemplary embodiment of the present invention. The protection circuit 1 of FIG. 1 can be accomplished by a protection circuit 1A shown in FIG. 2. Referring to FIG. 2, the trigger circuit 10 of the protection circuit 1A comprises transistors 20 and 21 and a resistor 22. The transistors 20 and 21 have the same conductivity type, and each of the transistors 20 and 21 comprises three electrode terminals, which are a first electrode terminal, a second electrode terminal, and a control electrode terminal, respectively. In the embodiment, the transistors 20 and 21 are both implemented by N-type metal-oxide-semiconductor (NMOS) transistors. In other words, the conductivity types of the transistors 20 and 21 are an N type. The first electrode terminal, the second electrode terminal, and the control electrode terminal of each of the transistors 20 and 21 are the drain, the source, and the gate of the NMOS transistor, respectively. As shown in FIG. 2, the drain (first electrode terminal) 200 of the NMOS transistor 20 is coupled to the bonding pad 12, the source (second electrode terminal) 201 thereof is coupled to a node N20, and the gate (control electrode terminal) 202 thereof is coupled to a node N21. The drain 210 of the NMOS transistor 21 is coupled to the node N20, the source 211 thereof is grounded to GND, and the gate 212 thereof is coupled to the node N21. According to the above connection structure, the NMOS transistors 20 and 21 are coupled in series between the bonding pad 12 and the ground terminal GND. The resistor 22 is coupled between the node N21 and the ground terminal GND.

As shown in FIG. 2, the discharge circuit 11 comprises a transistor 23. The transistor 23 comprises three electrode terminals, which are a first electrode terminal, a second electrode terminal, and a control electrode terminal, respectively. In the embodiment, the transistor 23 is also implemented by an NMOS transistor. The first electrode terminal, the second electrode terminal, and the control electrode terminal of the transistor 23 are the drain, the source, and the gate of the NMOS transistor 23, respectively. The drain 230 of the NMOS transistor 23 is coupled to the bonding pad 12, the source 231 thereof is coupled to the ground terminal GND, and the gate 232 thereof is coupled to the node N20. According to the above connection structure, the NMOS transistor 23 is also coupled between the bonding pad 12 and the ground terminal GND.

In the embodiment of the present invention, the withstand voltage of the NMOS transistor 23 is higher than the withstand voltage of each of the NMOS transistors 20 and 21. In an example, the NMOS transistors 20 and 23 are high-voltage transistors, and the withstand voltage of the NMOS transistor 23 is higher than that of the NMOS transistor 20. For example, the NMOS transistor 20 is a transistor with a withstanding voltage of 20 volts (V), the NMOS transistor 21 is a transistor with a withstanding voltage of 5V, and the NMOS transistor 23 is a transistor with a withstanding voltage of 24V, however, the present invention is not limited thereto.

In one embodiment, each of the NMOS transistors 20 and 23 may be implemented as a high-voltage transistor by increasing the dimension (for example, thickness, lateral diffusion distance) of the doped region of its drain.

In one embodiment, the channel width of each of the NMOS transistors 20 and 21 is about several hundreds of micrometers (um), and the channel width of the NMOS transistor 23 is about 100-150 kilomicrometers (kum). The resistance value of the resistor 22 is approximately in the range of 1-10 kiloohms (kohm).

The detailed operation of the protection circuit 1A will be described in the following paragraphs.

Figure 3A:
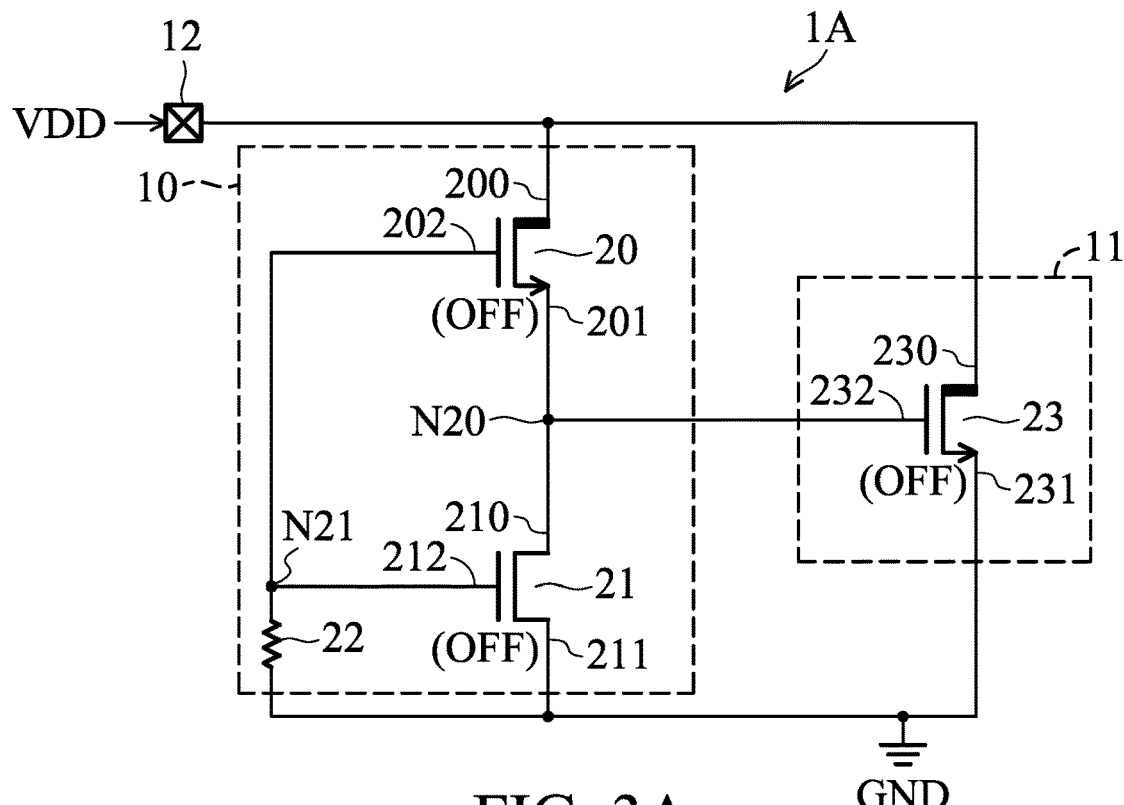
FIGS. 3A and 3B show schematic diagrams of the operation of the protection circuit of FIG. 2.

Referring to FIG. 3A, when the protection circuit 1A operates in a normal operation mode, a supply voltage VDD is provided to the bonding pad 12. In the embodiment, the supply voltage VDD is, for example, 24V. At this time, since the resistor 22 is coupled between the node N21 and the ground terminal GND, the voltage on the node N21 is at a low level relative to the supply voltage VDD, that is, the voltages on the gates 202 and 212 of the NMOS transistors 20 and 21 are at a low level. Based on the low-level voltages on the gates 202 and 212, the NMOS transistors 20 and 21 are both turned off. In FIG. 3A and subsequent figures, transistors that are turned off will be marked with "(OFF)". Since the NMOS transistors 20 and 21 are both turned off, the voltage on the node N20 is at a low level relative to the supply voltage VDD, that is, the voltage on the gate 232 of the NMOS transistor 23 is at a low level, which makes the NMOS transistor 23 turned off (OFF) OFF.

According to the above description, in the normal operation mode, all the NMOS transistors in the protection circuit 1A coupled between the bonding pad 12 and the ground terminal GND are in the turned-off state. In other words, the protection circuit 1A of the embodiment cuts off any the discharge path between the bonding pad 12 and the ground terminal GND. Therefore, in the normal operation mode, the protection circuit 1A does not cause unnecessary leakage current, avoiding unnecessary power consumption caused by the arrangement of the protection circuit 1A.

Figure 3B:
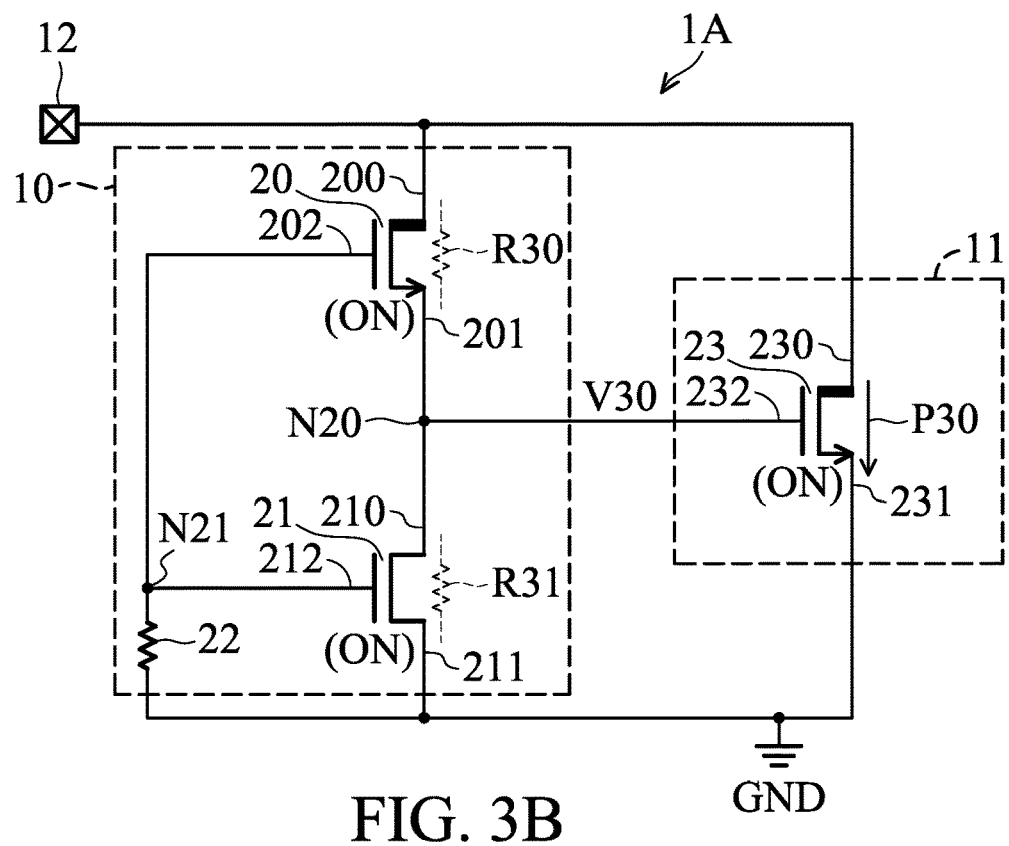

Referring to FIG. 3B, when the protection circuit 1A is not in the normal operation mode, the supply voltage VDD is not provided to the bonding pad 12. Thus, the bonding pad 12 is in a floating state, or the voltage of the bonding pads 12 is equal to 0V. When a transient event (for example, an ESD event or a surge event) occurs on the bonding pad 12, the voltage of the bonding pad 12 increases instantaneously. There is a parasitic capacitance between the drain 200 and the gate 202 of the transistor 20, which forms an RC circuit with the resistor 22. Through the coupling effect of the parasitic capacitance between the drain electrode 200 and the gate electrode 202, the voltage on the node N21 increases instantaneously with the voltage of the bonding pad 12. At this time, in response to the instantaneous increase of the voltage on the node N21, the NMOS transistors 20 and 21 are turned on instantaneously. In FIG. 3B and subsequent figures, a transistor that is turned on will be marked with "(ON)".

Due to the turned-on state of the NMOS transistors 20 and 21, the NMOS transistors 20 and 21 have respective on-resistance R30 and R31. The on-resistance R30 and R31 form a voltage divider. The voltage divider divides the voltage difference between the bonding pad 12 and the ground terminal GND to generate a trigger voltage V30 on the node N20. The trigger voltage V30 which is generated by the voltage dividing operation has a high level to turn on (ON) the NMOS transistor 23. Therefore, a discharge path P30 is formed between the bonding pad 12 and the ground terminal GND, so that the charges of the high current accompanying the transient event on the bonding pad 12 are conducted to the ground terminal GND through the discharge path P30.

According to the above description, when a transient event occurs on the bonding pad 12, the trigger circuit 10 can quickly generate a high-level trigger voltage V30 through the operations of the NMOS transistors 20 and 21 and the resistor 22 to trigger the discharge circuit 11 to provide the discharge path P30, so that a large amount of charges on the bonding pad 12 can be quickly conducted to the ground terminal GND through the discharge path P30, thereby protecting components in other circuits coupled to the bonding pad 12 from being damaged by the large current.

In the embodiment of FIG. 2, the bulk of the NMOS transistor 23 may be connected to its source 231, which is not shown in FIG. 2.

Figure 4:
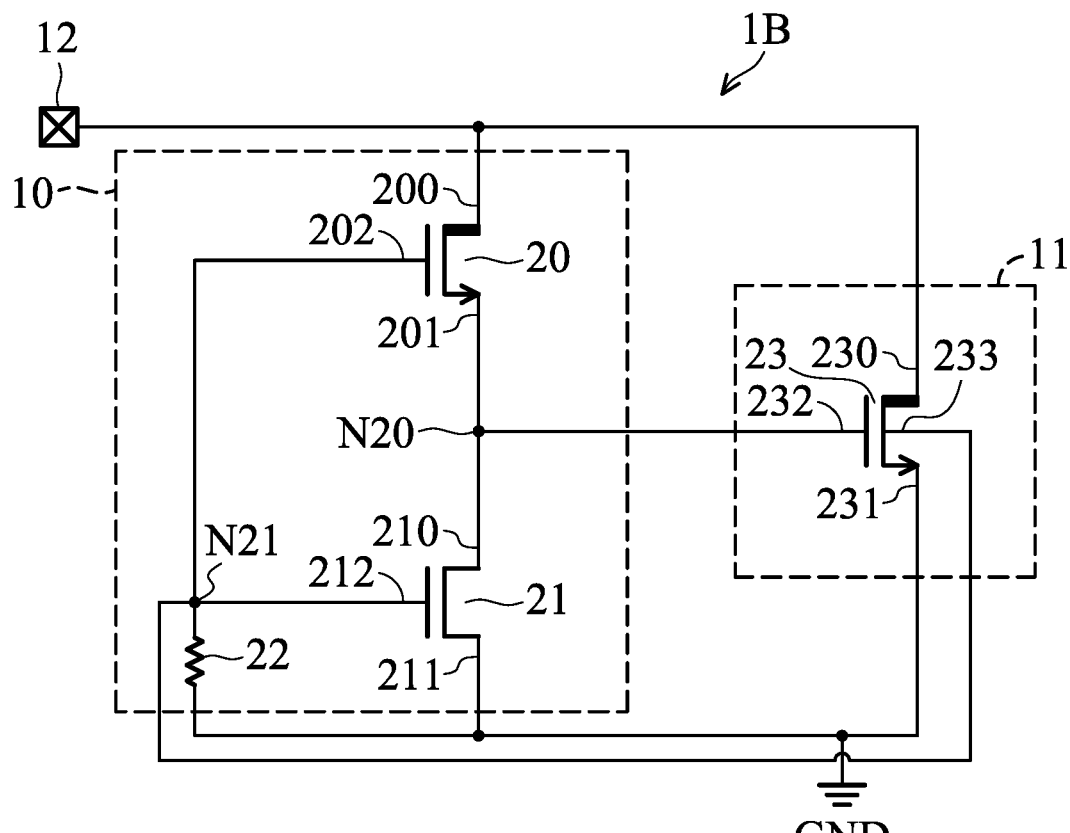
FIG. 4 shows a protection circuit according to another exemplary embodiment of the present invention.
Figure 5:
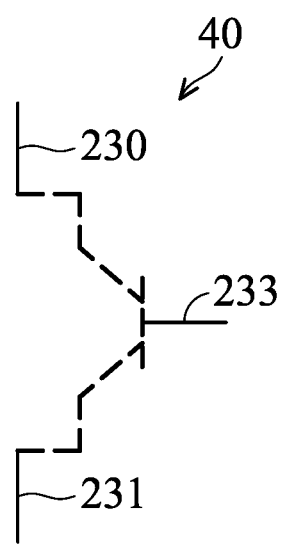
FIG. 5 shows a parasitic NPN bipolar junction transistor in the protection circuit of FIG. 4.

FIG. 4 shows a protection circuit according to another exemplary embodiment of the present invention. The protection circuit 1 of FIG. 1 can be accomplished by the protection circuit 1B of FIG. 4. The circuit configuration of the protection circuit 1B of FIG. 4 is substantially the same as the circuit configuration of the protection circuit TA of FIG. 2. Referring to FIG. 4, the difference between the protection circuits 1B and TA is the connection of the bulk 233 of the NMOS transistor 23. The bulk 233 of the NMOS transistor 23 is coupled to the node N21, that is, the bulk 233 is coupled to the gates 202 and 212 of the NMOS transistors 20 and 21.

Since the circuit structure of the protection circuit 1B in FIG. 4 is substantially the same as the circuit structure of the protection circuit TA in FIG. 2, the operation of the protection circuit 1B is also substantially the same as that of the protection circuit TA. Please refer to the above description related to FIGS. 3A and 3B. In the following paragraphs, the description of the same operation will be omitted, and only the operation of the NMOS transistor 23 will be specifically described.

Referring to FIG. 4, the drain 230, the source 231, and the bulk 233 of the NMOS transistor 23 form a parasitic NPN-type bipolar junction transistor (BJT) 40. The drain 230, the source 231, and the bulk 233 of the NMOS transistor 23 serve as the collector (C), the emitter (E), and the base (B) of the NPN-type BJT 40, respectively. When the protection circuit 1B operates in a normal operation mode, the voltage on the node N21 is at a low level relative to the supply voltage VDD. Based on the low-level voltage on the node N21 and the source 231 being coupled to the ground terminal GND, the NPN-type BJT 40 is turned off. In cases where the protection circuit 1B is not in the normal operation mode and a transient event occurs on the bonding pad 12, the base-emitter voltage ($V_{BE}$) of the NPN-type BJT 40 is greater than 0.7V due to the high level of the voltage on the node N21, which causes the NPN-type BJT 40 to be turned on. At this time, the electric charges of the large current accompanying the transient event on the bonding pad 12 are also conducted to the ground terminal GND through the turned-on NPN-type BJT 40.

As described above description, in the protection circuit 1B of FIG. 4, the bulk 233 of the NMOS transistor 23 is coupled to the node N21. Therefore, when a transient event occurs on the bonding pad 12, the parasitic NPN-type BJT 40 can be rapidly turned on in response to the high-level voltage of the node N21, thereby improving the overall discharge capability of the NMOS transistor 23.

Figure 6:
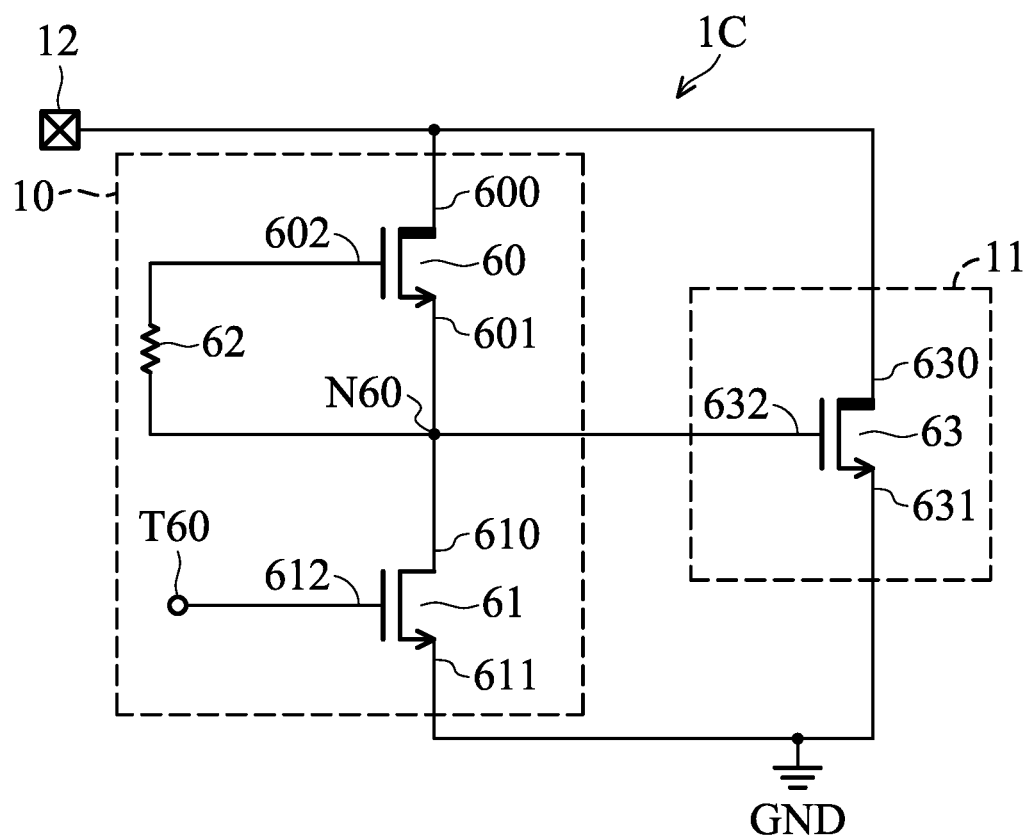
FIG. 6 shows a protection circuit according to another exemplary embodiment of the present invention.

FIG. 6 shows a protection circuit according to another exemplary embodiment of the present invention. The protection circuit 1 of FIG. 1 can be accomplished by the protection circuit 1C of FIG. 6. Referring to FIG. 6, the trigger circuit 10 of the protection circuit 1C may comprise transistors 60 and 61 and a resistor 62. The transistors 60 and 61 have the same conductivity type, and each of the transistors 60 and 61 has three electrode terminals, which are a first electrode terminal, a second electrode terminal, and a control electrode terminal, respectively. In the embodiment, the transistors 60 and 61 are both implemented by NMOS transistors, that is, the conductivity types of the transistors 60 and 61 are an N-type. The first electrode terminal, the second electrode terminal, and the control electrode terminal of each of the transistors 60 and 61 are the drain, the source, and the gate of the NMOS transistor, respectively. As shown in FIG. 6, the drain 600 of the NMOS transistor 60 is coupled to the bonding pad 12, and the source 601 thereof 60 is coupled to the node N60. The drain 610 of the NMOS transistor 61 is coupled to the node N60, the source 611 thereof is connected to the ground terminal GND, and the gate 612 thereof is coupled to a power terminal T60. According to the above connection structure, the NMOS transistors 60 and 61 are coupled in series between the bonding pad 12 and the ground terminal GND. The resistor 62 is coupled between the gate 602 of the NMOS transistor 60 and the node N60.

As shown in FIG. 6, the discharge circuit 11 comprises a transistor 63. The transistor 63 has three electrode terminals, which are a first electrode terminal, a second electrode terminal, and a control electrode terminal, respectively. In the embodiment, the transistor 63 is also implemented by an NMOS transistor. The first electrode terminal, the second electrode terminal, and the control electrode terminal of the transistor 63 are the drain electrode, the source electrode, and the gate electrode of the NMOS transistor, respectively. The drain 630 of the NMOS transistor 63 is coupled to the bonding pad 12, the source 631 thereof is grounded to GND, and the gate 632 thereof is coupled to the node N60. According to the above connection structure, the NMOS transistor 63 is coupled between the bonding pad 12 and the ground terminal GND.

In the embodiment of the present invention, the withstand voltage of the NMOS transistor 63 is higher than that of each of the NMOS transistors 60 and 61. In an example, the NMOS transistors 60 and 63 are high-voltage transistors, and the withstand voltage of the NMOS transistor 63 is higher than that of the NMOS transistor 60. For example, the NMOS transistor 60 is a transistor with a withstanding voltage of 20V, the NMOS transistor 61 is a transistor with a withstanding voltage of 5V, and the NMOS transistor 63 is a transistor with a withstanding voltage of 24V.

In one embodiment, NMOS transistors 60 and 63 can be implemented as high-voltage tolerant transistors by increasing the dimension (for example, vertical doped depth or lateral diffusion distance) of the doped region of its drain.

In one embodiment, the channel width of each of the NMOS transistors 60 and 61 are about several hundreds of micrometers (um), and the channel width of the NMOS transistor 63 is about 100-150 kilometers (kum). The resistance value of the resistor 62 is approximately in the range of 1-10 kiloohms (kohm).

The detailed operation of the protection circuit 1C will be described in the following paragraphs.

Figure 7A:
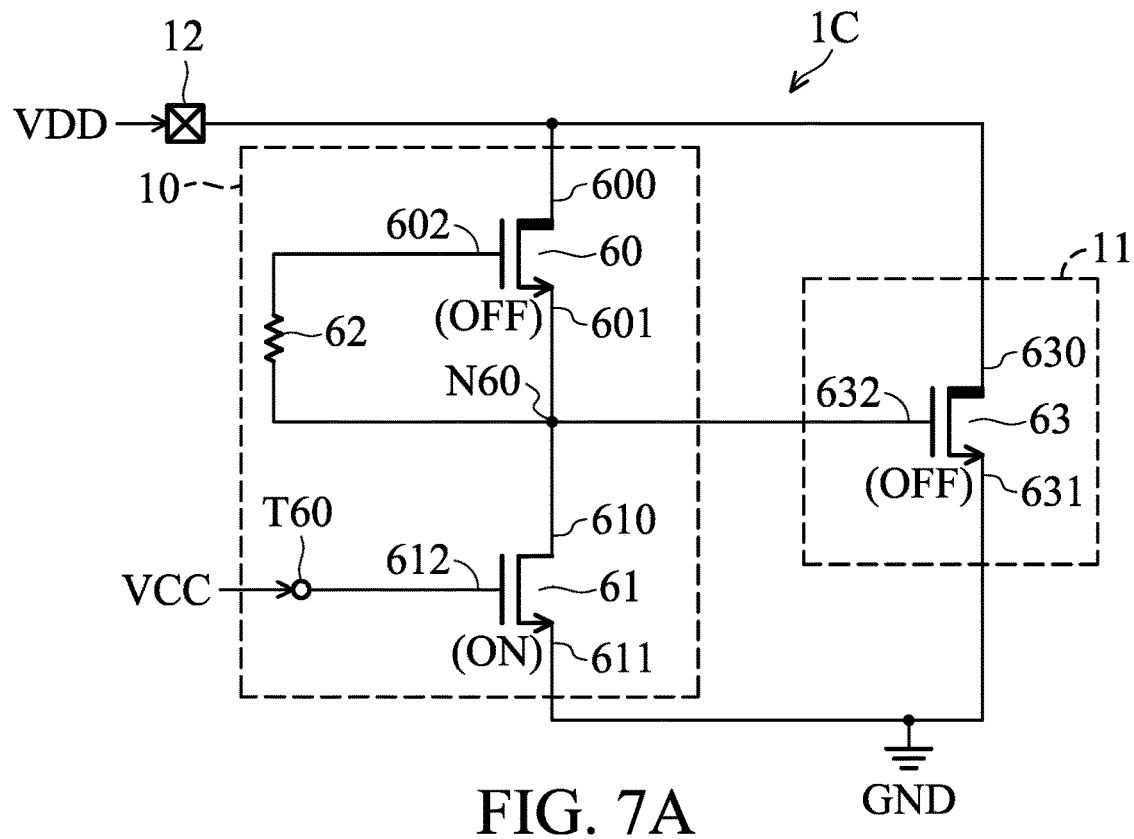
FIGS. 7A and 7B are schematic diagrams showing the operation of the protection circuit of FIG. 6.

Referring to FIG. 7A, when the protection circuit 1C operates in a normal operation mode, a supply voltage VDD is supplied to the bonding pad 12, and another supply voltage VCC is supplied to the power terminal T60. In the embodiment, the supply voltage VDD is, for example, 24V, and the supply voltage VCC is, for example, 5V. At this time, since the supply voltage VCC of 5V is supplied to the gate 612 of the NMOS transistor 61 through the power supply terminal T60, the NMOS transistor 61 is always in a turned-on state (ON). Through the turned-on NMOS transistor 61, the voltage on the node N60 is at a low level relative to the supply voltage VDD, that is, the voltage on the gate 632 of the NMOS transistor 63 is at a low level. Based on the low-level voltage on the gate 632, the NMOS transistor 63 is turned off (OFF). Moreover, through the resistor 62 coupled between the gate 602 of the NMOS transistor 60 and the node N60, the voltage of the gate 602 is at a low level relative to the supply voltage VDD. Based on the low-level voltage of the gate 602, the NMOS transistor 60 is turned off (OFF).

According to the above description, in the normal operation mode, the NMOS transistors 60 and 63 coupled between the bonding pad 12 and the ground terminal GND in the protection circuit 1C are in the turned-off state. In other words, the protection circuit 1C of the embodiment cuts off any discharge path between the bonding pad 12 and the ground terminal GND. Therefore, in the normal operation mode, the protection circuit 1C does not cause unnecessary leakage current, avoiding unnecessary power consumption caused by the arrangement of the protection circuit 1C.

Figure 7B:
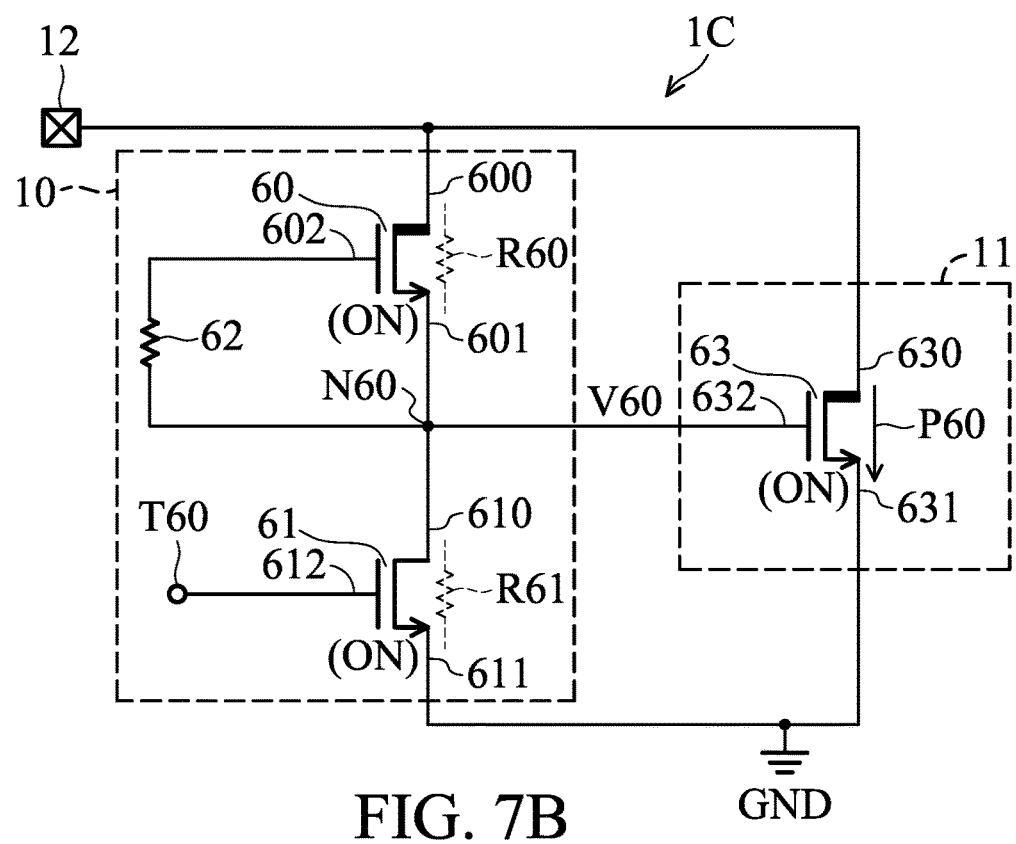

Referring to FIG. 7B, when the protection circuit 1C is not in the normal operation mode, the supply voltage VDD is not supplied to the bonding pad 12, and the supply voltage VCC is also not supplied to the power terminal T60. Thus, the bonding pad 12 and/or the power terminal T60 is in a floating state, or the voltage of at least one of the bonding pad 12 and the power terminal T60 is equal to 0V. When a transient event (for example, an ESD event or a surge event) occurs on the bonding pad 12, the voltage of the bonding pad 12 increases instantaneously. There is a parasitic capacitance between the drain 600 and the gate 602 of the transistor 60, which forms an RC circuit with the resistor 62. Through the coupling effect of the parasitic capacitance between the drain 600 and the gate 602, the voltage of the gate 602 of the NMOS transistor 60 increases instantaneously with the voltage of the bonding pad 12. At this time, in response to the instantaneous increase of the voltage of the gate 602, the NMOS transistor 60 is turned on (ON). In addition, since the power supply terminal T60 is in a floating state or the voltage of the power supply terminal T60 is equal to 0V, the NMOS transistor 61 is fully turned on (ON) or weakly turned on (ON).

Due to the turned-on state of the NMOS transistors 60 and 61, the NMOS transistors 60 and 61 have respective on-resistance R60 and R61. The on-resistance R60 and R61 form a voltage divider. The voltage divider divides the voltage difference between the bonding pad 12 and the ground terminal GND to generate a trigger voltage V60 on the node N60. The trigger voltage V60 generated by the voltage dividing operation has a high-level voltage to turn on the NMOS transistor 63. Therefore, a discharge path P60 is formed between the bonding pad 12 and the ground terminal GND, so that the charges of the large current accompanying the transient event on the bonding pad 12 are conducted to the ground terminal GND through the discharge path P60.

According to the above description, when a transient event occurs on the bonding pad 12, the trigger circuit 10 can quickly generate a high-level trigger voltage V60 through the operation of the NMOS transistors 60 and 61 and the resistor 62 to trigger the discharge circuit 11 to provide the discharge path P60, so that a large amount of charges on the bonding pad 12 can be quickly conducted to the ground terminal GND through the discharge path P60, thereby protecting components in other circuits coupled to the bonding pad 12 from being damaged by the large current.

In the embodiment of FIG. 6, the base of the NMOS transistor 63 may be connected to its source 631, which is not shown in FIG. 2.

Figure 8:
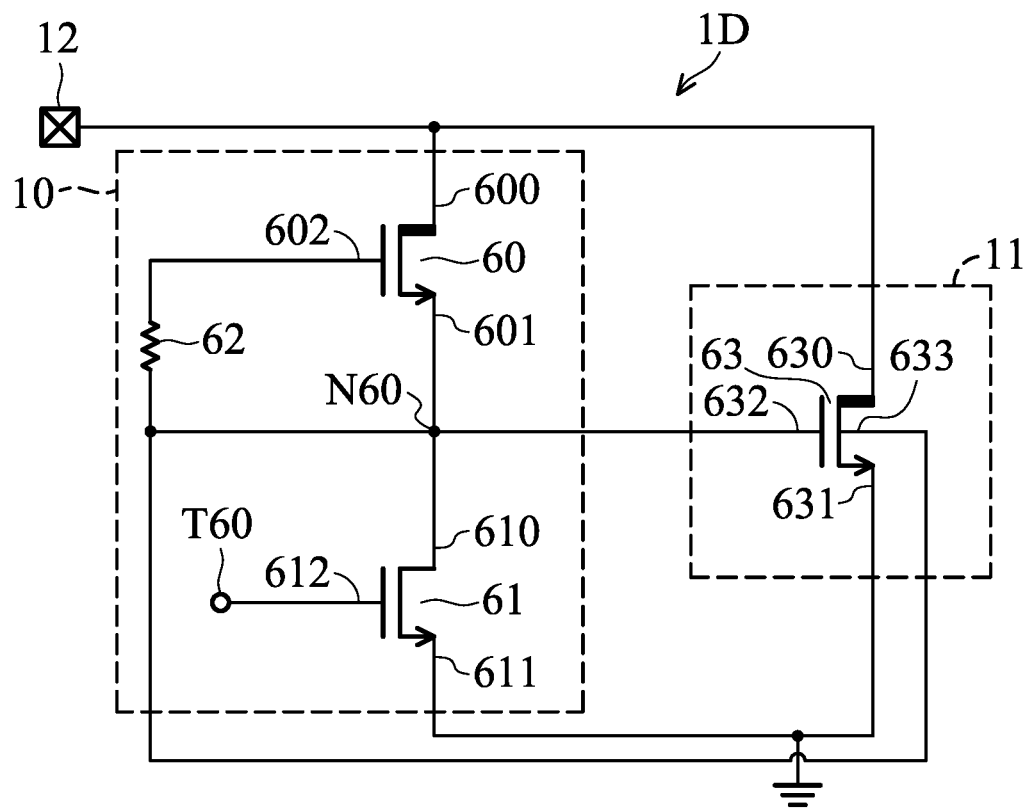
FIG. 8 shows a protection circuit according to another exemplary embodiment of the present invention.
Figure 9:
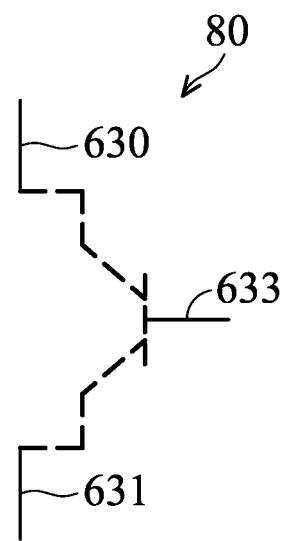
FIG. 9 shows a parasitic NPN bipolar junction transistor in the protection circuit of FIG. 8.

FIG. 8 shows a protection circuit according to another exemplary embodiment of the present invention. The protection circuit 1 of FIG. 1 can be accomplished by the protection circuit 1D of FIG. 8. The circuit configuration of the protection circuit 1D of FIG. 8 is substantially the same as the circuit configuration of the protection circuit 1C of FIG. 6. Referring to FIG. 8, the difference between the protection circuits 1D and 1C is the connection of the bulk 633 of the NMOS transistor 63. The bulk 633 of the NMOS transistor 63 is coupled to the node N60, that is, the bulk 633 is coupled to the gate 632 of the NMOS transistor 63.

Since the circuit structure of the protection circuit 1D of FIG. 8 is substantially the same as the circuit structure of the protection circuit 1C of FIG. 6, the operation of the protection circuit 1D is also substantially the same as that of the protection circuit 1C. Please refer to the description related to FIGS. 7A and 7B. In the following paragraphs, the description of the same operation will be omitted, and only the operation of the NMOS transistor 63 will be specifically described.

Referring to FIGS. 8, the drain 630, source 631, and bulk 633 of the NMOS transistor 63 form a parasitic NPN-type bipolar junction transistor (BJT) 80. The drain 630, the source 631, and the bulk 633 of the NMOS transistor 63 serve as the collector (C), the emitter (E), and the base (B) of the NPN-type BJT 80, respectively. When the protection circuit 1D operates in a normal operation mode, the voltage on the node N60 is at a low level relative to the supply voltage VDD. Based on the low-level voltage on the node N60 and the source 631 being coupled to the ground terminal GND, the NPN-type BJT 80 is turned off. In cases where the protection circuit ID is not in the normal operation mode and a transient event occurs on the bonding pad 12, the base-emitter voltage ($V_{BE}$) of the NPN-type BJT 80 is greater than 0.7 due to the high level of the trigger voltage V60 on the node N60, which causes the NPN-type BJT 80 to be turned on. At this time, the charges of the large current accompanying the transient event on the bonding pad 12 is conducted to the ground terminal GND further through the turned-on NPN-type BJT 80.

According to the above description, in the protection circuit 1D of FIG. 8, the bulk 633 of the NMOS transistor 63 is coupled to the node N60. Therefore, when a transient event occurs on the bonding pad 12, the parasitic NPN-type BJT 80 can be quickly turned on in response to the high-level voltage of the node N60, which improves the overall discharge capability of the NMOS transistor 63.

Figure 10A:
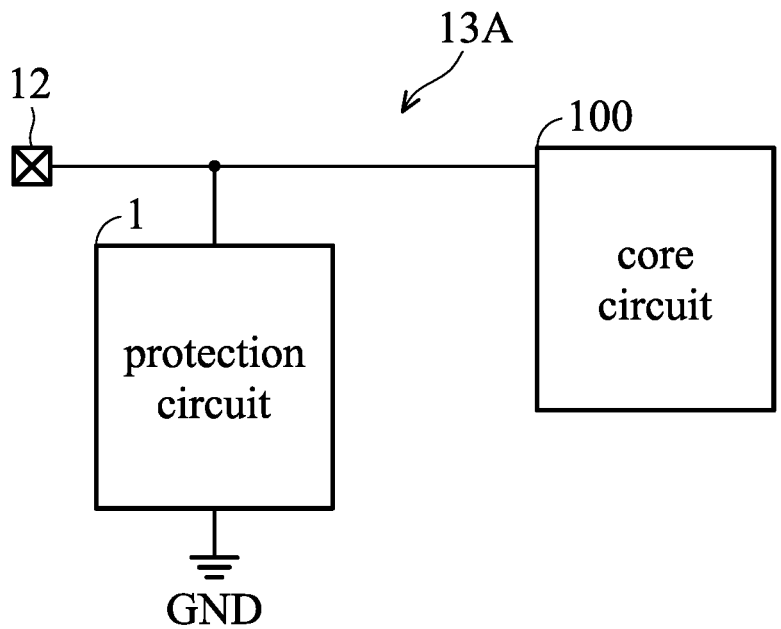
FIG. 10A shows an electronic circuit according to an exemplary embodiment of the present invention having a protection circuit according to any embodiment of the present invention.

FIG. 10A shows an electronic circuit according to an exemplary embodiment of the present invention. Referring to FIG. 10A, an electronic device 13A comprises a core circuit 100, the bonding pad 12, and the protection circuit 1 shown in FIG. 1 of the present invention. The protection circuit 1 can be accomplished by any one of the protection circuits 1A-1D shown in FIGS. 2, 4, 6, and 8. In the embodiment of FIG. 10A, the protection circuit 1 is arranged outside the core circuit 100. When a transient event occurs on the bonding pad 12, the protection circuit 1 provides or triggers to provide a discharge path between the bonding pad 12 and the ground terminal GND. A large amount of charges on the bonding pad 12 can be quickly conducted to the ground terminal GND through the discharge path, thereby protecting the components or circuits in the core circuit 100 from being damaged by the large current accompanying the transient event.

Figure 10B:
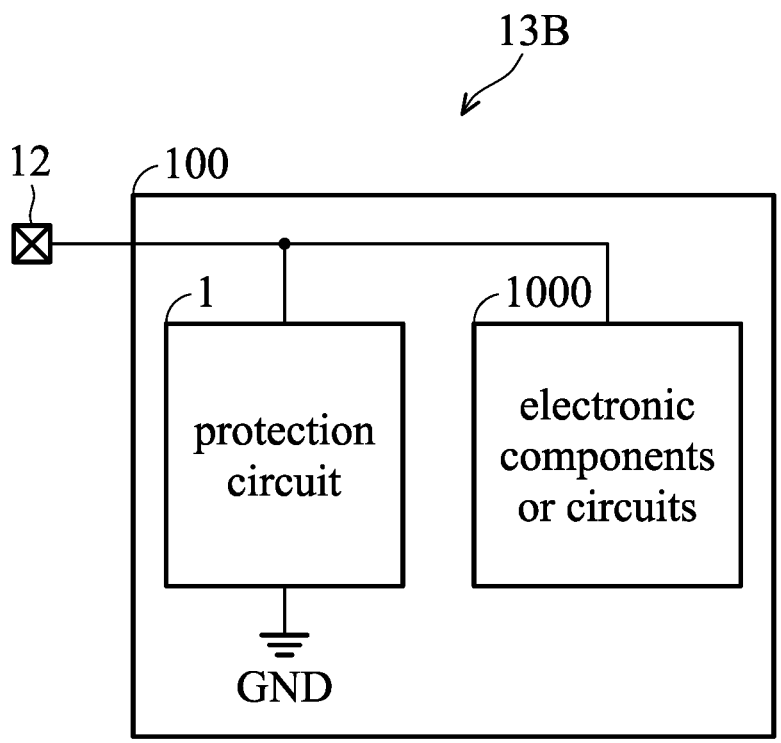
FIG. 10B shows an electronic circuit according to another exemplary embodiment of the present invention having the protection circuit of any of the embodiments of the present invention.

In other embodiments, the protection circuit 1 may be provided inside the core circuit 100. As shown in FIG. 10B, the protection circuit 1 and other electronic components or circuits 1000 are provided in the core circuit 100 of the electronic device 13B. When a transient event occurs on the bonding pad 12, the protection circuit 1 provides or triggers to provide a discharge path between the bonding pad 12 and the ground terminal GND. A large amount of charges on the bonding pad 12 can be quickly conducted to the ground terminal GND through the discharge path, thereby protecting the electronic components or circuit 1000 in the core circuit 100 from being damaged by the large current accompanying the transient event.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A protection circuit, coupled to a bounding pad, comprising:
   a trigger circuit comprising a first transistor of a first conductivity type and a second transistor of the first conductivity type coupled in series between the bonding pad and a ground terminal further comprising a resistor, wherein the trigger circuit detects whether a transient event occurs on the bonding pad; and
   a discharge circuit, coupled between the bonding pad and the ground terminal and controlled by the trigger circuit,
   wherein, in response to the transient event occurring on the bonding pad, the trigger circuit generates a trigger voltage to trigger the discharge circuit to provide a discharge path between the bonding pad and the ground terminal, and
   wherein:
      the first transistor comprises a first electrode terminal coupled to the bonding pad, a second electrode terminal coupled to a first node, and a control electrode terminal,
      the second transistor is coupled between the first node and the ground terminal, and
      the resistor is coupled between the control electrode terminal of the first transistor and the discharge circuit.

2. The protection circuit as claimed in claim 1, wherein in response to the transient event occurring on the bonding pad, the first transistor and the second transistor are both turned on.

3. The protection circuit as claimed in claim 1, wherein the discharge circuit comprises a third transistor of the first conductivity type coupled between the bonding pad and the ground terminal.

4. The protection circuit as claimed in claim 3, wherein the first conductivity type is N-type.

5. The protection circuit as claimed in claim 3, wherein the first transistor and the third transistor are high-voltage transistors.

6. The protection circuit as claimed in claim 3, wherein:
   the control electrode terminal of the first transistor is coupled to a second node,
   the second transistor comprises a first electrode terminal coupled to the first node, a second electrode terminal coupled to the ground terminal, and a control electrode terminal coupled to the second node,
   the third transistor comprises a first electrode terminal coupled to the bonding pad, a second electrode terminal coupled to the ground terminal, and a control electrode terminal coupled to the first node, and the trigger voltage is generated on the first node, and
   the resistor is coupled between the second node and the ground terminal.

7. The protection circuit as claimed in claim 6, wherein in response to a supply voltage being provided on the bonding pad, the first transistor, the second transistor, and the third transistor are turned off.

8. The protection circuit as claimed in claim 6, wherein the third transistor further comprises a bulk, and the bulk of the third transistor is coupled to the second node.

9. The protection circuit as claimed in claim 8, wherein in response to a supply voltage being provided on the bonding pad, the first transistor, the second transistor, and the third transistor are turned off.

10. The protection circuit as claimed in claim 3, wherein:
    the second transistor comprises a first electrode terminal coupled to the first node, a second electrode terminal coupled to the ground terminal, and a control electrode terminal coupled to a power terminal,
    the third transistor comprises a first electrode terminal coupled to the bonding pad, a second electrode terminal coupled to the ground terminal, and a control electrode terminal coupled to the first node, and the trigger voltage is generated on the first node, and
    the resistor is coupled between the control electrode terminal of the first transistor and the first node.

11. The protection circuit as claimed in claim 10, wherein in response to the bonding pad receiving a first supply voltage and the power terminal receiving a second supply voltage, the first transistor and the third transistor are turned off, and the second transistor is turned on.

12. The protection circuit as claimed in claim 10, wherein the third transistor further comprises a bulk, and the bulk of the third transistor is coupled to the first node.

13. The protection circuit as claimed in claim 12, wherein in response to the bonding pad receiving a first supply voltage and the power terminal receiving a second supply voltage, the first transistor and the third transistor are turned off, and the second transistor is turned on.

14. The protection circuit as claimed in claim 13, wherein the first supply voltage is greater than the second supply voltage.

15. The protection circuit as claimed in claim 3, wherein in response to the transient event occurring on the bonding pad, the first transistor, the second transistor, and the third transistor are turned on.

16. The protection circuit as claimed in claim 3, wherein size of the third transistor is larger than size of the first transistor and the second transistor.

17. The protection circuit as claimed in claim 3, wherein a withstand voltage of the third transistor is higher than a withstand voltage of each of the first transistor and the second transistor.

18. The protection circuit as claimed in claim 1, wherein a withstand voltage of the first transistor is higher than a withstand voltage of each of the second transistor and the second transistor.

19. The protection circuit as claimed in claim 1, wherein the protection circuit is a transient voltage suppressor (TVS).

* * * * *